US011705891B1

(12) United States Patent
Chinthu et al.

(10) Patent No.: US 11,705,891 B1
(45) Date of Patent: Jul. 18, 2023

(54) LEVEL SHIFTER WITH REDUCED STATIC POWER CONSUMPTION

(71) Applicant: GlobalFoundries U.S. Inc., Malta, NY (US)

(72) Inventors: Siva Kumar Chinthu, Bangalore (IN); Devesh Dwivedi, Bangalore (IN); Sundar Veerendranath Palle, Bangalore (IN); Lejan Pu, San Jose, CA (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 0 days.

(21) Appl. No.: 17/663,671

(22) Filed: May 17, 2022

(51) Int. Cl.
| | |
|---|---|
| H03K 19/0175 | (2006.01) |
| H03K 3/012 | (2006.01) |
| H03K 3/356 | (2006.01) |
| G11C 7/10 | (2006.01) |
| H03K 19/0185 | (2006.01) |

(52) U.S. Cl.
CPC ........... H03K 3/012 (2013.01); G11C 7/1051 (2013.01); G11C 7/1078 (2013.01); H03K 3/356113 (2013.01); H03K 19/0185 (2013.01); H03K 19/017509 (2013.01)

(58) Field of Classification Search
CPC ....... H03K 19/0175; H03K 19/017509; H03K 19/0185; H03K 19/018507; H03K 19/018521; H03K 3/012; H03K 3/356113; G11C 7/10; G11C 7/1051; G11C 7/1057; G11C 7/106; G11C 7/1078; G11C 7/1084; G11C 7/1087
See application file for complete search history.

(56) References Cited

U.S. PATENT DOCUMENTS 6,002,290 A * 12/1999 Avery .............. H03K 17/04123
 326/62
6,222,384 B1 * 4/2001 Kim ..................... G11C 7/1057
 365/189.11

OTHER PUBLICATIONS

Chen, Xi, et al., "A Sub-100mV Ultra-Low Voltage Level-Shifter using Current Limiting Cross-Coupled Technique for Wide-Range Conversion to I/O Voltage"; IEEE Access; Publication Date: Aug. 6, 2020; vol. 8; pp. 145577-145585.

(Continued)

*Primary Examiner* — Long Nguyen
(74) *Attorney, Agent, or Firm* — David Cain; Hoffman Warnick LLC

(57) ABSTRACT

Embodiments of the present disclosure provide a level shifter, including: first and second NMOS transistors, wherein the sources of the first and second NMOS transistors are coupled to a first voltage, the gate of the first NMOS transistor is connected to an inverse of an input signal that varies between a second voltage and a third voltage, and wherein the gate of the second NMOS transistor receives a buffer of the input signal. a breakdown protection circuit has third and fourth NMOS transistors, the gates of the third and fourth NMOS transistors being connected to the third voltage, the drain of the first NMOS transistor being connected to the source of the third NMOS transistor, and the drain of the second NMOS transistor being connected to the source of the fourth NMOS transistor. A pull-up circuit is connected to the drains of the third and fourth NMOS transistors.

18 Claims, 2 Drawing Sheets

(56) References Cited

OTHER PUBLICATIONS

Lanuzza, Marco, et al., "Low-Power Level Shifter for Multi-Supply Voltage Designs," IEEE Transactions on Circuit and Systems-II: Express Briefs, vol. 59, No. 12, Dec. 2012, 922-926.

Pan. D., et al.; "A low voltage to high voltage level shifter circuit for MEMS application"; Proceedings of the 15th Biennial University/ Government/ Industry Microelectronics Symposium (Cat. No.03CH37488), 2003, pp. 128-131, doi: 10.1109/UGIM.2003.1225712.

* cited by examiner

LEVEL SHIFTER WITH REDUCED STATIC POWER CONSUMPTION

TECHNICAL FIELD

Embodiments of the disclosure relate generally to integrated circuits. More specifically, the disclosure provides a level shifter structure for managing static power consumption in a device.

BACKGROUND

Integrated circuits often include multiple power domains operating with differing power supply voltages. To this extent, level shifters typically are employed to convert an output signal from a digital circuit operating at a lower voltage to a higher voltage so that the output signal may be used in a digital circuit operating at the higher voltage.

SUMMARY

Aspects of the disclosure provide a level shifter, including: first and second NMOS transistors each including a gate, drain, and source, wherein the sources of the first and second NMOS transistors are coupled to a first voltage, wherein the gate of the first NMOS transistor is connected to an inverse of an input signal that varies between a second voltage and a third voltage, and wherein the gate of the second NMOS transistor receives a buffer of the input signal; a breakdown protection circuit including third and fourth NMOS transistors each including a gate, drain, and source, wherein the gates of the third and fourth NMOS transistors are connected to the third voltage, the drain of the first NMOS transistor is connected to the source of the third NMOS transistor, and the drain of the second NMOS transistor is connected to the source of the fourth NMOS transistor; and a pull-up circuit supplied by a fourth voltage and connected to the drains of the third and fourth NMOS transistors, the pull-up circuit including: a first PMOS transistor including a gate, drain, and source; and a second PMOS transistor including a gate, drain, and source, wherein the drain of the third NMOS transistor is connected to the drain of the first PMOS transistor and the gate of the second PMOS transistor, wherein the drain of the fourth NMOS transistor is connected to the drain of the second PMOS transistor and the gate of the first PMOS transistor, and wherein the sources of the first and second PMOS transistors are coupled to the fourth voltage.

Another aspect of the disclosure is directed to a level shifter, including: a first NMOS transistor including a gate, drain, and source; a second NMOS transistor including a gate, drain, and source, wherein the sources of the first and second NMOS transistors are coupled to a first voltage, wherein the gate of the first NMOS transistor is connected to an inverse of an input signal that varies between a second voltage and a third voltage, and wherein the gate of the second NMOS transistor receives a buffer of the input signal; a third NMOS transistor including a gate, drain, and source; a fourth NMOS transistor including a gate, drain, and source, wherein the gates of the third and fourth NMOS transistors are connected to the third voltage, the drain of the first NMOS transistor is connected to the source of the third NMOS transistor, and the drain of the second NMOS transistor is connected to the source of the fourth NMOS transistor; a first PMOS transistor including a gate, drain, and source; a second PMOS transistor including a gate, drain, and source, wherein the drain of the third NMOS transistor is connected to the drain of the first PMOS transistor and the gate of the second PMOS transistor, wherein the drain of the fourth NMOS transistor is connected to the drain of the second PMOS transistor and the gate of the first PMOS transistor, and wherein the sources of the first and second PMOS transistors are coupled to the fourth voltage; and a first inverter coupled to the drain of the fourth NMOS transistor, the drain of the second PMOS transistor, and the gate of the first PMOS transistor.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure.

Figure 1:
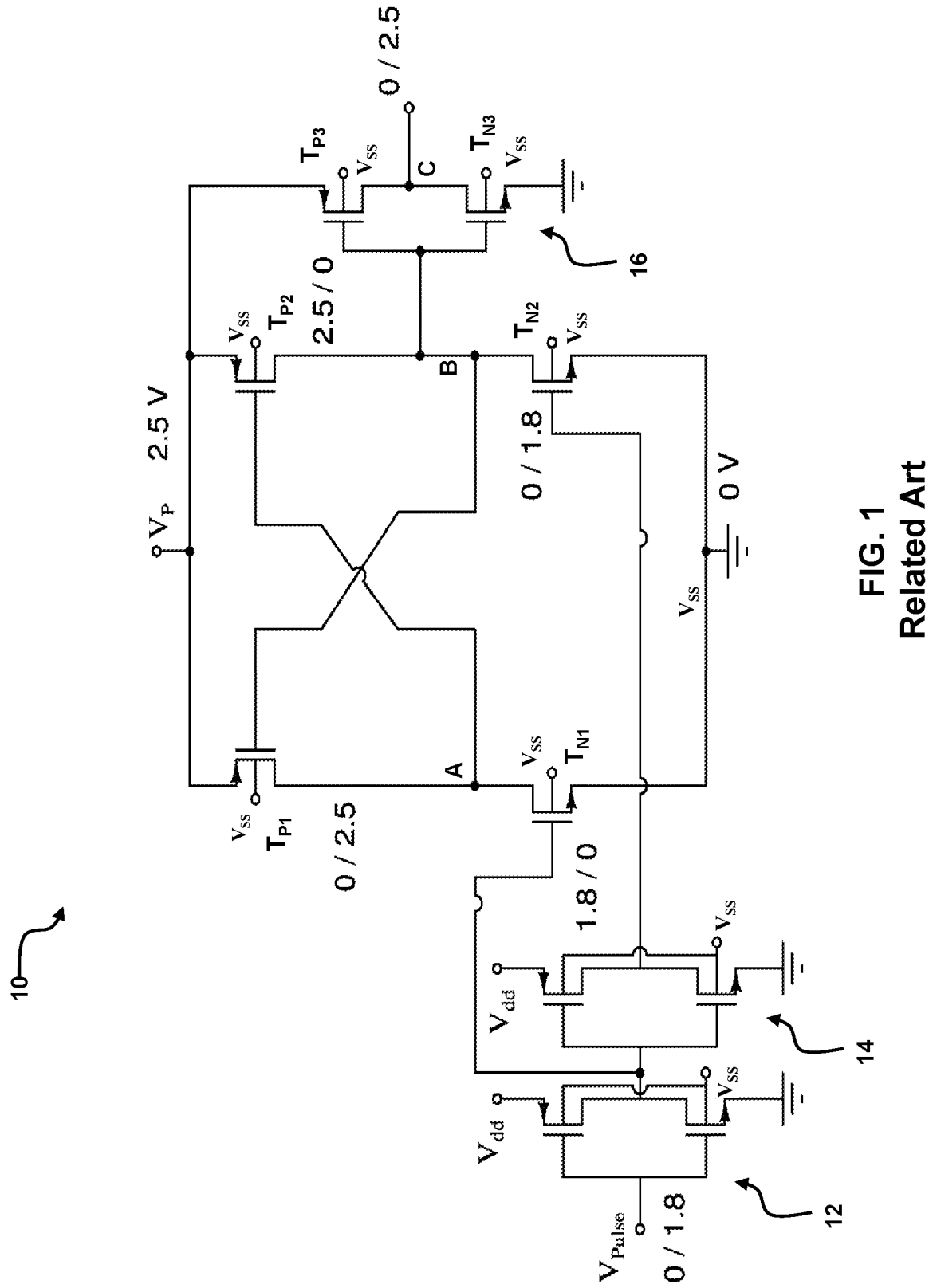
FIG. 1 depicts a conventional level shifter.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Various devices may implement level shifters to convert an output signal from a digital circuit operating at a lower voltage to a higher voltage. The level shifter allows the output signal to be transmitted to one or more digital circuits operating at the higher voltage. A conventional level shifter 10 for shifting a voltage level from a first voltage to a second, higher voltage (e.g., from 1.8 V to 2.5 V) is depicted in FIG. 1. As shown, an input signal with a voltage $V_{Pulse}$, which varies from, e.g., 0 V to 1.8 V, is provided to a first inverter 12. The output of the first inverter 12, which varies from 1.8 V to 0 V is provided to a second inverter 14, which outputs a voltage that also varies from 0 V to 1.8 V.

The output of the first inverter 12 (1.8 V/0 V) is applied to the gate of an NMOS transistor $T_{N1}$. The drain of the NMOS transistor $T_{N1}$ is connected to node A. The source of the NMOS transistor $T_{N1}$ is connected to $V_{SS}$ (0 V). The output of the second inverter 14 (0 V/1.8 V) is applied to the gate of an NMOS transistor $T_{N2}$. The drain of the NMOS transistor $T_{N2}$ is connected to node B. The source of the NMOS transistor $T_{N2}$ is also connected to $V_{SS}$ (0 V).

The conventional level shifter 10 further includes a cross-coupled pair of PMOS transistors, $T_{P1}$, $T_{P2}$. The source of the PMOS transistor $T_{P1}$ and the source of the PMOS transistor $T_{P2}$ are connected to a voltage $V_P$ (2.5 V). The drain of the PMOS transistor $T_{P1}$ and the gate of the PMOS transistor $T_{P2}$ are connected to node A. The drain of the PMOS transistor $T_{P2}$ and the gate of the PMOS transistor $T_{P1}$ are connected to node B. Node B is also connected to the input of a third inverter 16, which includes a PMOS transistor $T_{P3}$ and an NMOS transistor $T_{N3}$. The gates of the PMOS transistor $T_{P3}$ and the NMOS transistor $T_{N3}$ are connected to node B. The source of the PMOS transistor $T_{P3}$ is connected to $V_P$ (2.5 V). The drain of the PMOS transistor $T_{P3}$ is connected to the drain of the NMOS transistor $T_{N3}$. The source of the NMOS transistor $T_{N3}$ is connected to $V_{SS}$ (0 V). Node C is the output node of the level shifter 10.

In operation, when the input signal $V_{Pulse}$ is low (0 V), the output of the first inverter 12 is pulled to $V_{dd}$ (1.8 V), which turns on the NMOS transistor $T_{N1}$ and pulls node A to $V_{SS}$ (0 V). The output of the second inverter 14 is at $V_{SS}$ (0 V), which turns off the NMOS transistor $T_{N2}$. To this extent, since node A is at $V_{SS}$ (0 V), the PMOS transistor $T_{P2}$ is turned on, which pulls node B to $V_P$ (2.5 V). With node B at $V_P$ (2.5 V), the NMOS transistor $T_{N3}$ in the third inverter 16 is turned on, pulling node C to $V_{SS}$ (0 V). Thus, when $V_{Pulse}$ is low (0 V), the output of the level shifter 10 at node C is at $V_{SS}$ (0 V).

When the input signal $V_{Pulse}$ is high (1.8 V), the output of the first inverter 12 is at $V_{SS}$ (0 V) and the output of the second inverter 14 is at $V_{dd}$ (1.8 V). This turns on the NMOS transistor $T_{N2}$ and pulls node B to $V_{SS}$ (0 V). As a result, the PMOS transistor $T_{P1}$ is turned on, which pulls node A to $V_P$ (2.5 V). With node B at $V_{SS}$ (0 V), the PMOS transistor $T_{P3}$ in the third inverter 16 is turned on, pulling node C to $V_P$ (2.5 V). As such, when $V_{Pulse}$ is high (1.8 V), the output of the level shifter 10 at node C is at $V_P$ (2.5 V).

In the conventional level shifter 10 depicted in FIG. 1, the gate to source voltage experienced by the PMOS transistors $T_{P1}$ and $T_{P3}$ when $V_{Pulse}$ switches from low to high (0 V to 1.8 V), and the gate to source voltage experienced by the PMOS transistor $T_{P2}$ when $V_{Pulse}$ switches from high to low (1.8 V to 0 V), may be higher than the breakdown voltage of these transistors (e.g., greater than 1.98 V). Voltages of this magnitude may cause breakdown of these transistors in level shifter 10. The NMOS transistors $T_{N1}$, $T_{N2}$, and $T_{N3}$ are similarly affected.

Biasing circuits are often used to bias the internal nodes of conventional level shifters, such as the level shifter of FIG. 1, to limit or prevent breakdown of the PMOS and NMOS transistors. However, such biasing circuits are always on and continuously draw current, thus consuming static power.

Figure 2:
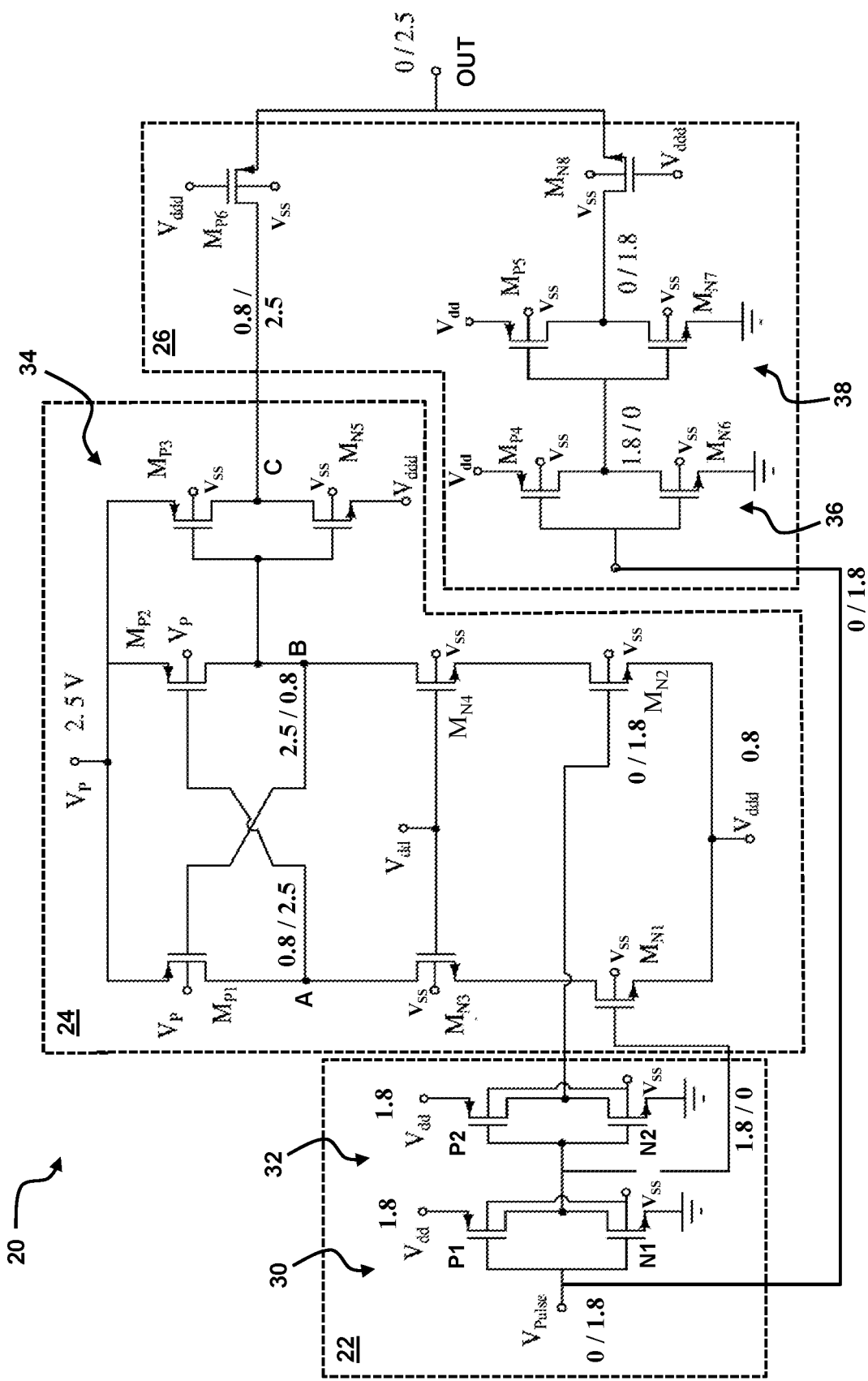
FIG. 2 is a level shifter according to embodiments of the disclosure.

A level shifter 20 for shifting a voltage level from a first voltage to a second, higher voltage according to embodiments of the disclosure is depicted in FIG. 2. In a non-limiting example, the level shifter 20 may increase the voltage level from a first voltage of 1.8 V to a second, higher voltage of 2.5 V, although other voltage transitions are possible. Advantageously, the PMOS and NMOS transistors in the level shifter 20 do not suffer breakdown as in the level shifter 10 depicted in FIG. 1. Further, biasing circuits are not included in the level shifter 20, reducing and limiting static power consumption.

The level shifter 20 according to embodiments of the disclosure includes an input section 22, a level shifting section 24, and an output section 26. As shown in FIG. 2, the level shifting section 24 of the level shifter 20 is configured to shift the voltage of an input signal $V_{Pulse}$ provided to the input section 22. Input signal $V_{Pulse}$ varies from 0 V to 1.8 V, and level shifter 20 shifts $V_{Pulse}$ to an output voltage that varies from 0.8 V to 2.5 V. The output section 26 of the level shifter 20 is configured to shift the output voltage of the level shifting section 24 (0.8 V/2.5 V) to the desired output voltage of the level shifter 20 (0 V/2.5 V).

As depicted in FIG. 2, the input section 22 includes a first inverter 30 and a second inverter 32 connected in series. The input signal $V_{Pulse}$ (0 V/1.8 V) is provided to the first inverter 30, which inverts the input signal $V_{Pulse}$ (1.8 V/0 V). The output of the first inverter 30 is provided to a second inverter 32, which outputs a buffer of the voltage $V_{Pulse}$ (0 V/1.8 V).

In the first inverter 30, the input signal $V_{Pulse}$ is connected to the gate of an NMOS transistor N1 and the gate of a PMOS transistor P1. The source of the NMOS transistor N1 is tied to $V_{SS}$ (0V). The drain of the NMOS transistor N1 is connected to the drain of the PMOS transistor P1. The source of the PMOS transistor P1 is connected to a supply voltage $V_{dd}$ (1.8 V). When the input signal $V_{Pulse}$ is low (0 V), the NMOS transistor N1 is turned off and the PMOS transistor P1 is turned on, pulling the output of the first inverter 30 to $V_{dd}$ (1.8 V). When the input signal $V_{Pulse}$ is high (1.8 V), the NMOS transistor N1 is turned on and the PMOS transistor P1 is turned off, pulling the output of the first inverter 30 to $V_{SS}$ (0 V). The bodies of the NMOS transistor N1 and the PMOS transistor P1 are biased at $V_{SS}$ (0 V).

In the second inverter 32, the output of the first inverter 30 (1.8 V/0 V) is connected to the gate of an NMOS transistor N2 and the gate of a PMOS transistor P2. The source of the NMOS transistor N2 is tied to $V_{SS}$ (0V). The drain of the NMOS transistor N2 is connected to the drain of the PMOS transistor P2. The source of the PMOS transistor P2 is connected to $V_{dd}$ (1.8 V). When the output of the first inverter 30 is low (0 V), the NMOS transistor N2 is turned off and the PMOS transistor P2 is turned on, pulling the output of the second inverter 32 to $V_{dd}$ (1.8 V). When the output of the first inverter 30 is high (1.8 V), the NMOS transistor N2 is turned on and the PMOS transistor P2 is turned off, pulling the output of the second inverter 32 to $V_{SS}$ (0 V). The bodies of the NMOS transistor N2 and the PMOS transistor P2 are biased at $V_{SS}$ (0 V).

The output of the first inverter 30 (1.8 V/0 V) is applied to the gate of an NMOS transistor $M_{N1}$ in the level shifting section 24 of the level shifter 20. The source of the NMOS transistor $M_{N1}$ is connected to a supply voltage $V_{ddd}$, which is set to a-non ground (i.e., non-zero) voltage, e.g., 0.8 V. The output of the second inverter 32 (0 V/1.8 V) is applied to the gate of an NMOS transistor $M_{N2}$ in the level shifting section 24. The source of the NMOS transistor $M_{N2}$ is also connected to $V_{ddd}$ (0.8 V). The bodies of the NMOS transistors $M_{N1}$ and $M_{N2}$ are biased at $V_{SS}$ (0 V). The NMOS transistor $M_{N1}$ and the NMOS transistor $M_{N2}$ form a pull-down circuit in the level shifting section 24 of the level shifter 20.

The drain of the NMOS transistor $M_{N1}$ is connected to the source of an NMOS transistor $M_{N3}$. The drain of the NMOS transistor $M_{N2}$ is connected to the source of an NMOS transistor $M_{N4}$. The gate of the NMOS transistor $M_{N3}$ and the gate of the NMOS transistor $M_{N4}$ are coupled to $V_{dd}$ (1.8 V). To this extent, the NMOS transistor $M_{N3}$ and the NMOS transistor $M_{N4}$ are turned on. The bodies of the NMOS transistors $M_{N3}$ and $M_{N4}$ are biased at $V_{SS}$ (0 V). The NMOS transistor $M_{N3}$ and the NMOS transistor $M_{N4}$ form a breakdown protection circuit in the level shifting section 24 of the level shifter 20.

The level shifter 20 also includes a cross-coupled pair of PMOS transistors, $M_{P1}$, $M_{P2}$. The source of the PMOS transistor $M_{P1}$ and the source of the PMOS transistor $M_{P2}$ are connected to a source voltage $V_P$ (2.5 V). The drain of the PMOS transistor $M_{P1}$, the gate of the PMOS transistor $M_{P2}$, and the drain of the NMOS transistor $M_{N3}$ are connected at node A. The drain of the PMOS transistor $M_{P2}$, the gate of the PMOS transistor $M_{P1}$, and the drain of the NMOS transistor $M_{N4}$ are connected at node B. The body of the PMOS transistor $M_{P1}$ and the body of the PMOS transistor $M_{P2}$ are biased at $V_P$ (2.5 V) to increase the threshold voltage of the PMOS transistor $M_{P1}$ and the PMOS transistor $M_{P2}$. This reduces leakage and improves the rise and fall transition times of the PMOS transistor $M_{P1}$ and the PMOS transistor $M_{P2}$.

Node B is also connected to the input of a third inverter 34, which includes a PMOS transistor MP3 and an NMOS transistor $M_{N5}$. The gate of the PMOS transistor MP3 and the gate of the NMOS transistor $M_{N5}$ are connected to node B. The source of the PMOS transistor MP3 is connected to $V_P$ (2.5 V). The drain of the PMOS transistor MP3 is connected to the drain of the NMOS transistor $M_{N5}$. The source of the NMOS transistor $M_{N5}$ is connected to $V_{ddd}$ (0.8 V). Node C is the output node of the level shifting section 24 of the level shifter 20. The bodies of the PMOS transistor MP3 and the NMOS transistor $M_{N5}$ are biased at $V_{SS}$ (0 V). The PMOS transistors $M_{P1}$, $M_{P2}$ and the third inverter form a pull-up circuit in the in the level shifting section 24 of the level shifter 20, The operation of the input section 22 and the level shifting section 24 of the level shifter 20 will now be described.

When the input signal $V_{Pulse}$ is low (0 V), the output of the first inverter 30 of the input section 22 is pulled to $V_{dd}$ (1.8 V), which turns on the NMOS transistor $M_{N1}$. This charges node A to $V_{ddd}$ (0.8 V). The output of the second inverter 32 is low (0 V), which turns off the NMOS transistor $N_{N2}$.

To this extent, since node A is at $V_{ddd}$ (0.8 V), the PMOS transistor $N_{P2}$ is turned on, which pulls node B to $V_P$ (2.5 V). With node B at $V_P$ (2.5 V), the NMOS transistor $M_{N5}$ in the third inverter 34 is turned on, pulling node C to $V_{ddd}$ (0.8 V). Thus, when $V_{Pulse}$ is low (0 V), the output of the level shifting section 24 of the level shifter 20 at node C is at $V_{ddd}$ (0.8 V).

When the input signal $V_{Pulse}$ is high (1.8 V), the output of the first inverter 30 is at $V_{SS}$ (0 V) and the output of the second inverter 32 is at $V_{dd}$ (1.8 V). This turns on the NMOS transistor $M_{N2}$ and turns off the NMOS transistor $M_{N1}$. As a result, node B is charged to $V_{ddd}$ (0.8 V). With node B at $V_{ddd}$ (0.8 V), the PMOS transistor $M_{P1}$ is turned on, which pulls node A to $V_P$ (2.5 V). Also, the PMOS transistor MP3 in the third inverter 34 is turned on, pulling node C to $V_P$ (2.5 V).

As previously described, unlike conventional level shifter 10 of FIG. 1, level shifter 20 according to embodiments of the disclosure provides NMOS transistors $M_{N3}$ and $M_{N4}$ between the NMOS transistors $M_{N1}$ and $M_{N2}$ and nodes A and B, respectively. By applying a voltage of $V_{dd}$ (1.8 V) to the gates of the NMOS transistors $M_{N3}$ and $M_{N4}$, the voltage at the drains of the NMOS transistors $M_{N1}$, $M_{N2}$ is limited to a value less than the breakdown voltage of the NMOS transistors $M_{N1}$, $M_{N2}$. To this extent, the NMOS transistors $M_{N1}$, $M_{N2}$ do not suffer breakdown when nodes A and B are pulled to $V_P$ during operation of the level shifter 20. A voltage other than $V_{dd}$ (1.8 V) may be applied to the gates of the NMOS transistors $M_{N3}$ and $M_{N4}$ as long as the voltage at the drains of the NMOS transistors $M_{N1}$, $M_{N2}$ is limited to a value less than the breakdown voltage of the NMOS transistors $M_{N1}$, $M_{N2}$.

In level shifter 20 according to embodiments of the disclosure, the PMOS transistors $M_{P1}$ and MP3 do not experience a gate to source voltage that is higher than their breakdown voltage when $V_{Pulse}$ switches from low to high (0 V to 1.8 V). Further, the PMOS transistor $M_{P2}$ does not experience a gate to source voltage that is higher than its breakdown voltage when $V_{Pulse}$ switches from high to low (1.8 V to 0 V). Rather, by applying a voltage $V_{ddd}$ (0.8 V) to the sources of the NMOS transistors $M_{N1}$, $M_{N2}$, and $M_{N5}$, the maximum gate to source voltage experienced by the PMOS transistors $M_{P1}$, $M_{P2}$, and MP3 is limited to a value that is less than the breakdown voltage of these transistors. As an example, the maximum gate to source voltage experienced by the PMOS transistors $M_{P1}$, $M_{P2}$, and MP3 (e.g., 1.86V) is less than the breakdown voltage of these transistors (e.g., 1.98V). In general, this can be achieved by providing a voltage $V_{ddd}$ such that $V_P$-$V_{ddd}$ is less than the breakdown voltage of the PMOS transistors.

In the output section 26 of the level shifter 20, the input signal $V_{Pulse}$ (0 V/1.8 V) is provided to a fourth inverter 36, which inverts the input signal $V_{Pulse}$ (1.8 V/0 V). The output of the fourth inverter 36 is provided to a fifth inverter 38, which outputs a voltage $V_{Pulse}$ (0 V/1.8 V).

In the fourth inverter 36, the input signal $V_{Pulse}$ is connected to the gate of an NMOS transistor $M_{N6}$ and the gate of a PMOS transistor MP4. The source of the NMOS transistor $M_{N6}$ is tied to $V_{SS}$ (0V). The drain of the NMOS transistor $M_{N6}$ is connected to the drain of the PMOS transistor MP4. The source of the PMOS transistor MP4 is connected to $V_{dd}$ (1.8 V). When the input signal $V_{Pulse}$ is low (0 V), the NMOS transistor $M_{N6}$ is turned off and the PMOS transistor MP4 is turned on, pulling the output of the fourth inverter 36 to $V_{dd}$ (1.8 V). When the input signal $V_{Pulse}$ is high (1.8 V), the NMOS transistor $M_{N6}$ is turned on and the PMOS transistor MP4 is turned off, pulling the output of the fourth inverter 36 to $V_{SS}$ (0 V). The bodies of the NMOS transistor $M_{N6}$ and the PMOS transistor MP4 are biased at $V_{SS}$ (0 V).

In the fifth inverter 38, the output of the fourth inverter 36 (1.8 V/0 V) is connected to the gate of an NMOS transistor $M_{N7}$ and the gate of a PMOS transistor $M_{P5}$. The source of the NMOS transistor $M_{N7}$ is tied to $V_{SS}$ (0V). The drain of the NMOS transistor $M_{N7}$ is connected to the drain of the PMOS transistor $M_{P5}$. The source of the PMOS transistor $M_{P5}$ is connected to $V_{dd}$ (1.8 V). When the output of the fourth inverter 36 is low (0 V), the NMOS transistor $M_{N7}$ is turned off and the PMOS transistor $M_{P5}$ is turned on, pulling the output of the fifth inverter 38 to $V_{dd}$ (1.8 V). When the output of the fourth inverter 36 is high (1.8 V), the NMOS transistor $M_{N7}$ is turned on and the PMOS transistor $M_{P5}$ is turned off, pulling the output of the fifth inverter 38 to $V_{SS}$ (0 V). The bodies of the NMOS transistor $M_{N7}$ and the PMOS transistor $M_{P5}$ are biased at $V_{SS}$ (0 V).

The output of the fifth inverter 38 is connected to the drain of an NMOS transistor $M_{N8}$. The gate of the NMOS transistor $M_{N8}$ is connected to $V_{ddd}$ (0.8 V). The source of the NMOS transistor $M_{N8}$ is connected to an output node OUT of the level shifter 20. The body of the NMOS transistor $M_{N8}$ is biased at $V_{SS}$ (0 V).

The output section 26 further includes a PMOS transistor $M_{P6}$. The drain of the PMOS transistor $M_{P6}$ is connected to node C, which is the output of the level shifting section 24 of the level shifter 20. The source of the PMOS transistor $M_{P6}$ is connected to the output node OUT. The body of the PMOS transistor $M_{P6}$ is biased at $V_{SS}$ (0 V).

The output section 26 of the level shifter 20 is configured to shift the output voltage of the level shifting section 24 at node C (0.8 V/2.5 V) to the desired output voltage of the level shifter 20 (0 V/2.5 V) at the output node OUT. When $V_{Pulse}$ is low (0 V), the output of the fifth inverter 38 is at $V_{SS}$ (0 V). With the gate of the NMOS transistor $M_{N8}$ at $V_{ddd}$ (0.8 V), the NMOS transistor $M_{N8}$ is turned on, pulling the output node OUT to $V_{SS}$ (0 V). The PMOS transistor $M_{P6}$ is turned off when $V_{Pulse}$ is low (0 V). As such, when $V_{Pulse}$ is low (0 V), the output of the level shifter 20 at the output node OUT is at $V_{SS}$ (0 V).

When $V_{Pulse}$ is high (1.8 V), the output of the fifth inverter 38 is at $V_{dd}$ (1.8 V). With the gate of the PMOS transistor $M_{P6}$ at $V_{ddd}$ (0.8 V), the PMOS transistor $M_{P6}$ is turned on, pulling the output node OUT to $V_P$ (2.5 V). The NMOS transistor $M_{N8}$ is turned off when $V_{Pulse}$ is high (1.8 V). As such, when $V_{Pulse}$ is high (1.8 V), the output of the level shifter 20 at the output node OUT is at $V_P$ (2.5 V).

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

As used herein, the term "configured," "configured to" and/or "configured for" can refer to specific-purpose patterns of the component so described. For example, a system or device configured to perform a function can include a computer system or computing device programmed or otherwise modified to perform that specific function. In other cases, program code stored on a computer-readable medium (e.g., storage medium), can be configured to cause at least one computing device to perform functions when that program code is executed on that computing device. In these cases, the arrangement of the program code triggers specific functions in the computing device upon execution. In other examples, a device configured to interact with and/or act upon other components can be specifically shaped and/or designed to effectively interact with and/or act upon those components. In some such circumstances, the device is configured to interact with another component because at least a portion of its shape complements at least a portion of the shape of that other component. In some circumstances, at least a portion of the device is sized to interact with at least a portion of that other component. The physical relationship (e.g., complementary, size-coincident, etc.) between the device and the other component can aid in performing a function, for example, displacement of one or more of the device or other components, engagement of one or more of the device or other components, etc.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A level shifter, comprising:
   first and second NMOS transistors each including a gate, drain, and source, wherein the sources of the first and second NMOS transistors are coupled to a first voltage, wherein the gate of the first NMOS transistor is connected to an inverse of an input signal that varies between a second voltage and a third voltage, and wherein the gate of the second NMOS transistor receives a buffer of the input signal;
   a breakdown protection circuit including third and fourth NMOS transistors each including a gate, drain, and source, wherein the gates of the third and fourth NMOS transistors are connected to the third voltage, the drain of the first NMOS transistor is connected to the source of the third NMOS transistor, and the drain of the second NMOS transistor is connected to the source of the fourth NMOS transistor; and
   a pull-up circuit supplied by a fourth voltage and connected to the drains of the third and fourth NMOS transistors, the pull-up circuit including:
   a first PMOS transistor including a gate, drain, and source; and
   a second PMOS transistor including a gate, drain, and source,
   wherein the drain of the third NMOS transistor is connected to the drain of the first PMOS transistor and the gate of the second PMOS transistor, wherein the drain of the fourth NMOS transistor is connected to the drain of the second PMOS transistor and the gate of the first PMOS transistor, and wherein the sources of the first and second PMOS transistors are coupled to the fourth voltage, and
   wherein the first voltage is greater than the second voltage, the third voltage is greater than the first voltage, and the fourth voltage is greater than the third voltage.

2. The level shifter according to claim 1, wherein the first voltage is greater than zero.

3. The level shifter according to claim 1, wherein a gate to source voltage of the first and second PMOS transistors is less than a breakdown voltage of the first and second PMOS transistors.

4. The level shifter according to claim 1, wherein a voltage at the drains of the first and second NMOS transistors is less than a breakdown voltage of the first and second NMOS transistors.

5. The level shifter according to claim 1, wherein the pull-up circuit is configured to generate an output that is:
   at the first voltage when the input signal is at the second voltage; and
   at the fourth voltage when the input signal is at the third voltage.

6. The level shifter according to claim 1, wherein a body of the first PMOS transistor and a body of the second PMOS transistor are biased at the fourth voltage.

7. The level shifter according to claim 1, wherein the pull-up circuit further comprises an inverter circuit including:
   a fifth NMOS transistor having a gate, drain, and source; and
   a third PMOS transistor having a gate, drain, and source, wherein:
     the gate of the fifth NMOS transistor and the gate of the third PMOS transistor are connected to the drain of the fourth NMOS transistor, the drain of the second PMOS transistor, and the gate of the first PMOS transistor;
     the drain of the fifth NMOS transistor is connected to the drain of the third PMOS transistor;

the source of the third PMOS transistor is connected to the fourth voltage; and the source of the fifth NMOS transistor is connected to the first voltage.

8. The level shifter according to claim 1, further comprising an output section coupled to an output of the pull-up circuit, wherein the output section is configured to:

convert the output of the pull-up circuit from the first voltage to the second voltage when the input signal is at the second voltage, and output the second voltage at an output node; and output the fourth voltage at the output node when input signal is at the third voltage.

9. The level shifter according to claim 8, wherein the output section comprises:

first and second inverters connected in series, the first inverter receiving the input signal; and a sixth NMOS transistor having a gate, drain, and source, wherein the gate of the sixth NMOS transistor is coupled to the first voltage, the drain of the sixth NMOS transistor is connected to an output of the second inverter, and the source of the sixth NMOS transistor is connected to the output node.

10. The level shifter according to claim 8, wherein the output section comprises a fourth PMOS transistor having a gate, drain, and source, wherein the gate of the fourth PMOS transistor is coupled to the first voltage, the drain of the fourth PMOS transistor is coupled to the output of the pull-up circuit, and the source of the fourth PMOS transistor is coupled to the output node.

11. A level shifter, comprising:

a first NMOS transistor including a gate, drain, and source;

a second NMOS transistor including a gate, drain, and source, wherein the sources of the first and second NMOS transistors are coupled to a first voltage, wherein the gate of the first NMOS transistor is connected to an inverse of an input signal that varies between a second voltage and a third voltage, and wherein the gate of the second NMOS transistor receives a buffer of the input signal;

a third NMOS transistor including a gate, drain, and source;

a fourth NMOS transistor including a gate, drain, and source, wherein the gates of the third and fourth NMOS transistors are connected to the third voltage, the drain of the first NMOS transistor is connected to the source of the third NMOS transistor, and the drain of the second NMOS transistor is connected to the source of the fourth NMOS transistor;

a first PMOS transistor including a gate, drain, and source;

a second PMOS transistor including a gate, drain, and source, wherein the drain of the third NMOS transistor is connected to the drain of the first PMOS transistor and the gate of the second PMOS transistor, wherein the drain of the fourth NMOS transistor is connected to the drain of the second PMOS transistor and the gate of the first PMOS transistor, and wherein the sources of the first and second PMOS transistors are coupled to a fourth voltage; and a first inverter coupled to the drain of the fourth NMOS transistor, the drain of the second PMOS transistor, and the gate of the first PMOS transistor, wherein the first voltage is greater than the second voltage, the third voltage is greater than the first voltage, and the fourth voltage is greater than the third voltage.

12. The level shifter according to claim 11, wherein the first voltage is greater than zero.

13. Level shifter according to claim 11, wherein a gate to source voltage of the first and second PMOS transistors is less than a breakdown voltage of the first and second PMOS transistors.

14. The level shifter according to claim 11, wherein a voltage at the drains of the first and second NMOS transistors is less than a breakdown voltage of the first and second NMOS transistors.

15. The level shifter according to claim 11, wherein a body of the first PMOS transistor and a body of the second PMOS transistor are biased at the fourth voltage.

16. The level shifter according to claim 11, further comprising an output section coupled to an output of the first inverter, wherein the output section is configured to:

convert the output of the first inverter from the first voltage to the second voltage when the input signal is at the second voltage, and output the second voltage at an output node; and output the fourth voltage at the output node when input signal is at the third voltage.

17. The level shifter according to claim 16, wherein the output section comprises:

second and third inverters connected in series, the second inverter receiving a buffer of the input signal; and a fifth NMOS transistor having a gate, drain, and source, wherein the gate of the fifth NMOS transistor is coupled to the first voltage, the drain of the fifth NMOS transistor is connected to an output of the second inverter, and the source of the fifth NMOS transistor is connected to the output node.

18. The level shifter according to claim 16, wherein the output section comprises third PMOS transistor having a gate, drain, and source, wherein the gate of the third PMOS transistor is coupled to the first voltage, the drain of the third PMOS transistor is coupled to the output of the first inverter, and the source of the third PMOS transistor is coupled to the output node.

* * * * *